(12) United States Patent
Hiroshi et al.

(10) Patent No.: US 7,874,066 B2
(45) Date of Patent: Jan. 25, 2011

(54) METHOD OF MANUFACTURING A DEVICE-INCORPORATED SUBSTRATE

(75) Inventors: Asami Hiroshi, Shizuoka (JP); Orui Ken, Kanagawa (JP); Kusano Hidetoshi, Kanagawa (JP); Fumito Hiwatashi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/523,331

(22) PCT Filed: Jun. 20, 2003

(86) PCT No.: PCT/JP03/07872

§ 371 (c)(1),
(2), (4) Date: Nov. 7, 2005

(87) PCT Pub. No.: WO2004/014114

PCT Pub. Date: Feb. 12, 2004

(65) Prior Publication Data

US 2006/0124345 A1  Jun. 15, 2006

(30) Foreign Application Priority Data

Jul. 31, 2002  (JP) ............................. 2002-223846

(51) Int. Cl.
*H05K 3/20* (2006.01)
*H05K 3/34* (2006.01)
*H05K 3/46* (2006.01)

(52) U.S. Cl. ............................. 29/831; 29/832; 29/840; 29/841; 29/846; 156/233; 156/236; 156/237; 205/125; 216/13; 216/100

(58) Field of Classification Search .................. 29/829, 29/830, 831, 832, 840, 841, 842, 843, 844, 29/846, 847, 848, 852, 853; 216/13, 100; 156/230, 236, 237, 233; 205/67, 70, 118, 205/125

See application file for complete search history.

(56) References Cited

U.S. PATENT DOCUMENTS 4,604,160 A * 8/1986 Murakami et al. ............ 216/18

(Continued)

FOREIGN PATENT DOCUMENTS

DE  199 10 482  5/2000

(Continued)

*Primary Examiner*—A. Dexter Tugbang
*Assistant Examiner*—Livius R Cazan
(74) *Attorney, Agent, or Firm*—Robert J. Depke; Rockey, Depke & Lyons, LLC

(57) ABSTRACT

A device-incorporated substrate and a method of manufacturing a device-incorporated substrate, as well as a printed circuit board and a method of manufacturing a printed circuit board in which a fine-pitch conductor pattern can be formed on an insulating layer with high precision while securing the dimensional stability of the conductor pattern, are provided. A transfer sheet (61) has a structure that includes two layers, a metal base material (62) and a dissolvee metal layer (64), and a conductor pattern (55) is formed on the dissolvee metal layer (64) through electroplating. Then, after the transfer sheet (61) on which the conductor pattern (55) is formed is adhered onto an insulating base material (51), the transfer sheet (61) is removed through a step of separating the metal base material (62) from the dissolvee metal layer (64), and a step of selectively dissolving and removing the dissolvee metal layer (64) with respect to the conductor pattern (55).

13 Claims, 10 Drawing Sheets

U.S. PATENT DOCUMENTS

| | | | |
|---|---|---|---|
| 4,606,787 A * | 8/1986 | Pelligrino | 216/18 |
| 4,790,902 A | 12/1988 | Wada et al. | |
| 5,882,957 A | 3/1999 | Lin | |
| 6,038,133 A | 3/2000 | Nakatani et al. | |
| 6,338,767 B1 * | 1/2002 | Nakatani et al. | 156/233 |
| 6,532,651 B1 * | 3/2003 | Andou et al. | 29/852 |
| 6,898,850 B2 * | 5/2005 | Kanzawa et al. | 29/846 |
| 6,977,348 B2 * | 12/2005 | Ho et al. | 174/255 |
| 2003/0178227 A1 * | 9/2003 | Matsunaga et al. | 174/257 |

FOREIGN PATENT DOCUMENTS

| | | |
|---|---|---|
| EP | 1 282 343 | 2/2003 |
| JP | 60-170292 | 9/1985 |
| JP | 63-72189 | 4/1988 |
| JP | 63-88895 | 4/1988 |
| JP | 01-186697 | 7/1989 |
| JP | 50-55758 | 3/1993 |
| JP | 08-23166 | 1/1996 |
| JP | 2000-183530 | 6/2000 |
| JP | 3051700 | 6/2000 |

* cited by examiner

METHOD OF MANUFACTURING A DEVICE-INCORPORATED SUBSTRATE

This application claims priority to Japanese Patent Application Number JP2002-223846, filed Jul. 31, 2002 which is incorporated herein by reference.

TECHNICAL FIELD

The present invention relates to a method for manufacturing a device-incorporated substrate in which the formation of a conductor pattern is performed through a transfer method using a transfer sheet. More specifically, the present invention relates to a method for manufacturing a device-incorporated substrate that are superior in terms of dimensional stability and through which a fine-pitch conductor pattern can be formed.

BACKGROUND ART

In recent years, with the increasing reduction in size and the advance in functionality of electronic devices, such as mobile phones, PDAs (Personal Digital Assistants), laptop PCs and the like, high-density packaging of electronic components used in them is becoming essential. Conventionally, high-density packaging of electronic components has been achieved by making component terminals more fine-pitched as a result of making electronic components smaller, by making the conductor pattern on a printed circuit board on which electronic components are mounted finer, and so forth.

In addition, in recent years, the development of multi-layer printed circuit boards which make three-dimensional wiring possible by layering printed circuit boards is being advanced, and further, the development of device-incorporated substrates that aim to further improve packaging efficiency by having electronic components, such as chip resistors, chip capacitors and the like, and electric devices, such as semiconductor chips and the like, built into these multilayer printed circuit boards is also being advanced.

As a method of forming a conductor pattern for a printed circuit board, a transfer method using a transfer sheet is conventionally known. The process of manufacturing a printed circuit board using this transfer method includes, mainly, a pattern formation step for forming a conductor pattern on one surface of a transfer sheet, and a pattern transfer step for removing the transfer sheet after the transfer sheet has been adhered to an insulation layer with the formed conductor pattern in between.

A printed circuit board produced through a transfer method can be easily multilayered by forming, in desired places of the insulation layer, via-holes for connecting the layers.

As conventional art of this sort, for example in Japanese Patent No. 3051700, a method of manufacturing a device-incorporated substrate using a transfer method is disclosed. Hereinafter, a conventional method of manufacturing a device-incorporated substrate will be described with reference to FIG. 11A through FIG. 11F.

FIG. 11A through FIG. 11F are stepwise sectional views showing a conventional method of manufacturing a device-incorporated substrate. A void section 32 for housing a semiconductor chip 36 and via-hole conductors 33 for connecting layers and which are made by filling through-holes with a conductive paste are each formed in an insulating base material 31 (FIG. 11A). On the other hand, on one side of a transfer sheet 34 is formed a conductor pattern 35 to be transferred onto the insulating base material 31 (FIG. 11B).

Here, the insulating base material 31 is comprised of a thermo-setting resin that is partially cured, and the transfer sheet 34 is comprised of a resin film of polyethylene terephthalate (PET) or the like. In addition, the conductor pattern 35 is formed by performing pattern etching on a conductor foil, such as a copper foil or the like, that is adhered to the transfer sheet 34 in advance.

Next, the semiconductor chip 36 is bonded to a predetermined position of the conductor pattern 35 formed on the transfer sheet 34 (FIG. 11C). Then, the upper surface of the insulating base material 31 and the side of the transfer sheet 34 on which there is the conductor pattern 35 are pressure bonded and the semiconductor chip 36 is housed inside the void section 32, while the conductor pattern 35 is connected with the via-hole conductors 33 (FIG. 11D). The conductor pattern is buried in the upper surface of the partially cured insulating base material 31, and thereafter, just the transfer sheet 34 is removed from the insulating base material 31. Then, by completely curing the base material 31 through a heat treatment, a device-incorporated substrate 30 is obtained (FIG. 11E).

In addition, as shown in FIG. 11F, by layering insulating base materials 39 and 40 on which conductor patterns 37 and 38, respectively, are formed through a method similar to the one above onto the above-mentioned device-incorporated substrate 30, a multi-layered printed circuit board 41 is obtained.

However, in this conventional method of manufacturing a device incorporated substrate, because the transfer sheet 34 is comprised chiefly of a resin film, there is a problem in that due to stretching and warpage in the transfer sheet 34 caused during handling, errors in the pattern configuration of the conductor pattern 35 to be transferred occur with greater likelihood. Therefore, with this conventional method of manufacturing a device-incorporated substrate, it is extremely difficult to accommodate the trend towards finer (more fine-pitched) conductor patterns, which is to progress further in the future.

In addition, the conductor pattern 35 formed on the transfer sheet 34 is formed, as disclosed in Japanese Patent Application Publication No. HEI 9-270578 for example, by pattern etching a metal foil adhered onto the transfer sheet 34, or, as disclosed in Japanese Patent Application Publication No. HEI 10-335787 for example, by pattern etching a metal layer that is formed on the transfer sheet 34 directly through sputtering or the like. As the method of etching, wet etching is adopted.

In other words, in the conventional method of manufacturing a device-incorporated substrate, because wet etching is used in the formation of the conductor pattern 35, there is a problem which is that, in the future, it is going to become difficult to form fine-pitch patterns with high precision.

On the other hand, it is also conceivable to have the transfer sheet be made of a metal material such as stainless steel or the like. In this case, because the rigidity is higher as compared to a case where the transfer sheet is made of a resin film, the dimensional stability of the conductor pattern is improved. However, in this case, there is a problem in that if the rigidity of the insulating base material, which is the transfer target, is high, it becomes difficult to remove the transfer sheet from the insulating base material and the transfer operation for the conductor pattern cannot be performed properly.

The present invention is made in view of the problems above, and makes it an issue to provide a method for manufacturing a device-incorporated substrate in which the dimensional stability of the conductor pattern is secured to make it possible to form a fine-pitch conductor pattern on an insulating layer with high precision and in which the removal of the transfer sheet can be performed properly.

DISCLOSURE OF THE INVENTION

In solving the issues above, in the present invention, by making the transfer sheet metallic and giving the transfer sheet electrical conductivity, forming a fine-pitch conductor pattern with high precision is made possible using a pattern plating technique by an additive method.

When transferring the formed conductor pattern to the insulating layer, the transfer sheet is removed from the insulating layer after the transfer sheet and the insulating layer have been adhered to each other. In the present invention, because the transfer sheet is comprised chiefly of a metal material, there is hardly any dimensional change during handling, and thus, the dimensional stability of the conductor pattern to be transferred is secured.

In addition, in the present invention, the removal of the transfer sheet from the insulating layer is done mainly by dissolving and removing the transfer sheet. Thus, even in cases where the insulating layer, which is the transfer target, has strong rigidity, it is possible to ensure a proper transfer operation for the conductor pattern.

Especially, the present invention is characterized by that after forming a seal resin between an electric device housed into a void section formed in an insulating layer and a conductor pattern formed on the insulating layer and connected to the electric device, a step of removing a transfer sheet is performed. According to the present invention, the conductor pattern, after the device is connected thereto, is supported by both the transfer sheet and the sealing resin layer, and thus it is secured to form the fine-pitch conductor pattern with high precision.

Here, the transfer sheet may be so configured to include a metal base material, and a dissolvee metal layer that is layered so as to be separable with respect to the metal base material and onto which a conductor pattern is formed. The metal base material accounts for the main portion of the entire thickness of the transfer sheet, and is so made that it has, mainly, mechanical properties or material properties which are essential at the time of handling. When such a metal base material is separated and removed from the dissolvee metal layer, the dissolvee metal layer, which is part of the transfer sheet, remains on the conductor pattern that has been transferred onto the insulating layer. As such, by dissolving and removing this dissolvee metal layer, the transfer sheet is completely removed from the insulating layer. In such a case, since the time required for the dissolution and removal of the transfer sheet can be shortened, the removal process for the transfer sheet is simplified.

BRIEF DESCRIPTION OF THE DRAWINGS

FIG. 4A shows a device housing step, and FIG. 4B through FIG. 4D show a step for removing a transfer sheet;

BEST MODES FOR CARRYING OUT THE INVENTION

Figure 1:
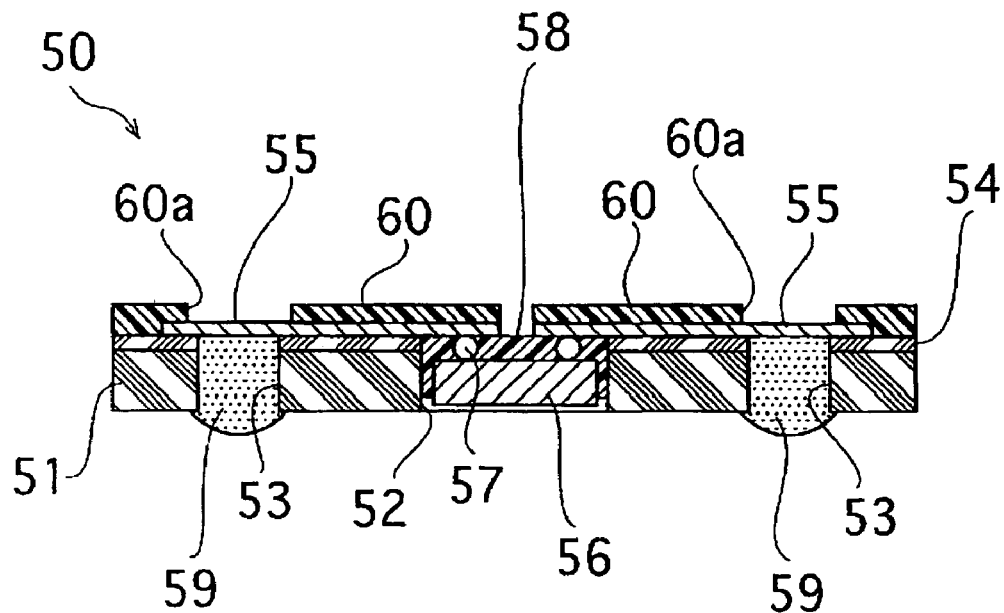
FIG. 1 is a sectional view that shows, schematically, the configuration of a device-incorporated substrate according to a first embodiment of the present invention.

Hereinafter, each embodiment of the present invention is described with reference to the drawings.

First Embodiment

FIG. 1 through FIG. 5D show the configuration of a device-incorporated substrate 50 according to the first embodiment of the present invention. An insulating base material 51, which constitutes an insulating layer, has formed therein a void section 52 for housing a semiconductor chip 56 as an electric device, and through-holes 53, 53 for connecting the front and back sides of the insulating base material 51. The through-holes 53, 53 are filled with an electrically conductive material 59, such as solder and the like.

In the present embodiment, the insulating base material is comprised of a resin base material of mainly a thermoplastic resin material, however, it is not limited thereto, and may be selected as deemed appropriate depending on the application or usage. For example, glass fiber impregnated with epoxy resin, glass fiber impregnated with polyimide resin, or paper impregnated with phenol resin or the like may be used. In addition, bismaleimide triazine resin, benzo-cyclo-butene resin, liquid crystal polymers and the like may also be used.

For the electrically conductive material 59 that the through-holes 53 are filled with, either a leaded or non-leaded solder material may be used, but from an ecological point of view, it is preferable that a non-leaded solder material be used. As non-leaded solder materials, alloys of Sn—Ag to which Bi, In, Cu, Sb and the like are added are well known. In addition, as electrically conductive materials other than solder materials, an electrically conductive paste that is obtained by mixing electrically conductive particles, such as silver powder, copper powder and the like, in resin may be used, for example.

On the surface of the insulating base material 51, there is provided an electrically non-conductive adhesive 54, and a conductor pattern 55 that has been patterned to a predetermined configuration is adhered onto this adhesive 54. The conductor pattern 55 is comprised of, for example, an electroplated film of copper, and is electrically bonded to the semiconductor chip 56 housed within the void section 52, while it is also electrically connected with the electrically conductive material 59 inside the through-holes 53. In the present invention, as will be described later, the conductor pattern 55 is formed on the insulating base material 51 by a transfer method.

The semiconductor chip 56 in the present embodiment is comprised of a bare chip, and gold or gold plated bumps (metal protrusive electrodes) 57 are formed on an aluminum electrode pad section provided on its bonding surface (active surface). In addition, the bumps 57 may be, besides the ball bumps shown in the drawing, stud bumps or plated bumps. Further, instead of semiconductor bare chips, semiconductor packaging components, such as BGA/CSP and the like, in which bumps are formed in rows or within a given area may also be used for the present invention.

Inside the void section 52 and between the conductor pattern 55 and the semiconductor chip 56 is formed an underfill resin layer 58 comprised of thermosetting adhesive resin, such as epoxy resin and the like, for example. The semiconductor chip 56 maintains its bond with the conductor pattern 55 by virtue of the underfill resin layer 58. In addition, the semiconductor chip 56 within the void section 52 may also be completely sealed with the same resin material.

The surface side of the conductor pattern 55 is covered with a solder resist 60, but openings 60a, 60a are formed in places corresponding to the through-holes 53, and thus the conductor pattern 55 is exposed.

According to the device-incorporated substrate 50 of the present embodiment, since the conductor pattern 55 is comprised of an electroplated layer, it becomes possible to make the conductor pattern 55 finer pitched, and thus, it is possible to achieve a further improvement in packaging density.

Figure 2:
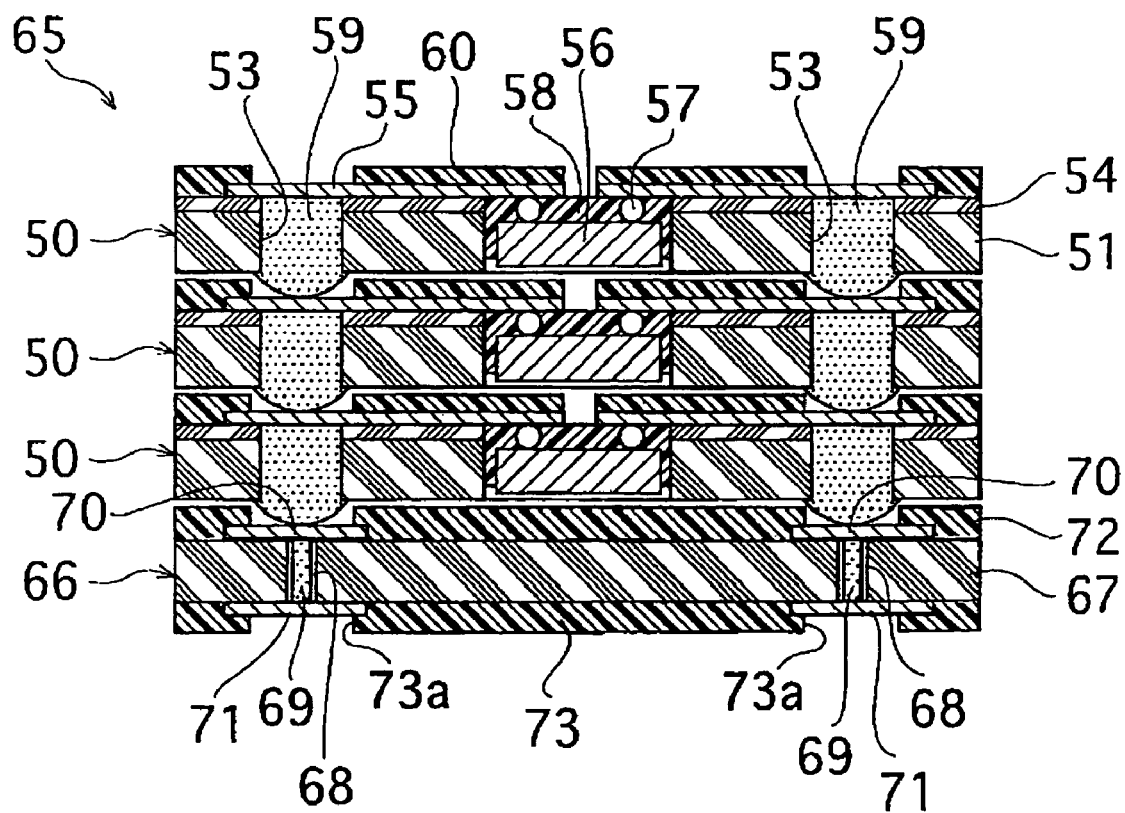
FIG. 2 is a sectional view showing a state where the device-incorporated substrate shown in FIG. 1 has been multi-layered.
Figure 3:
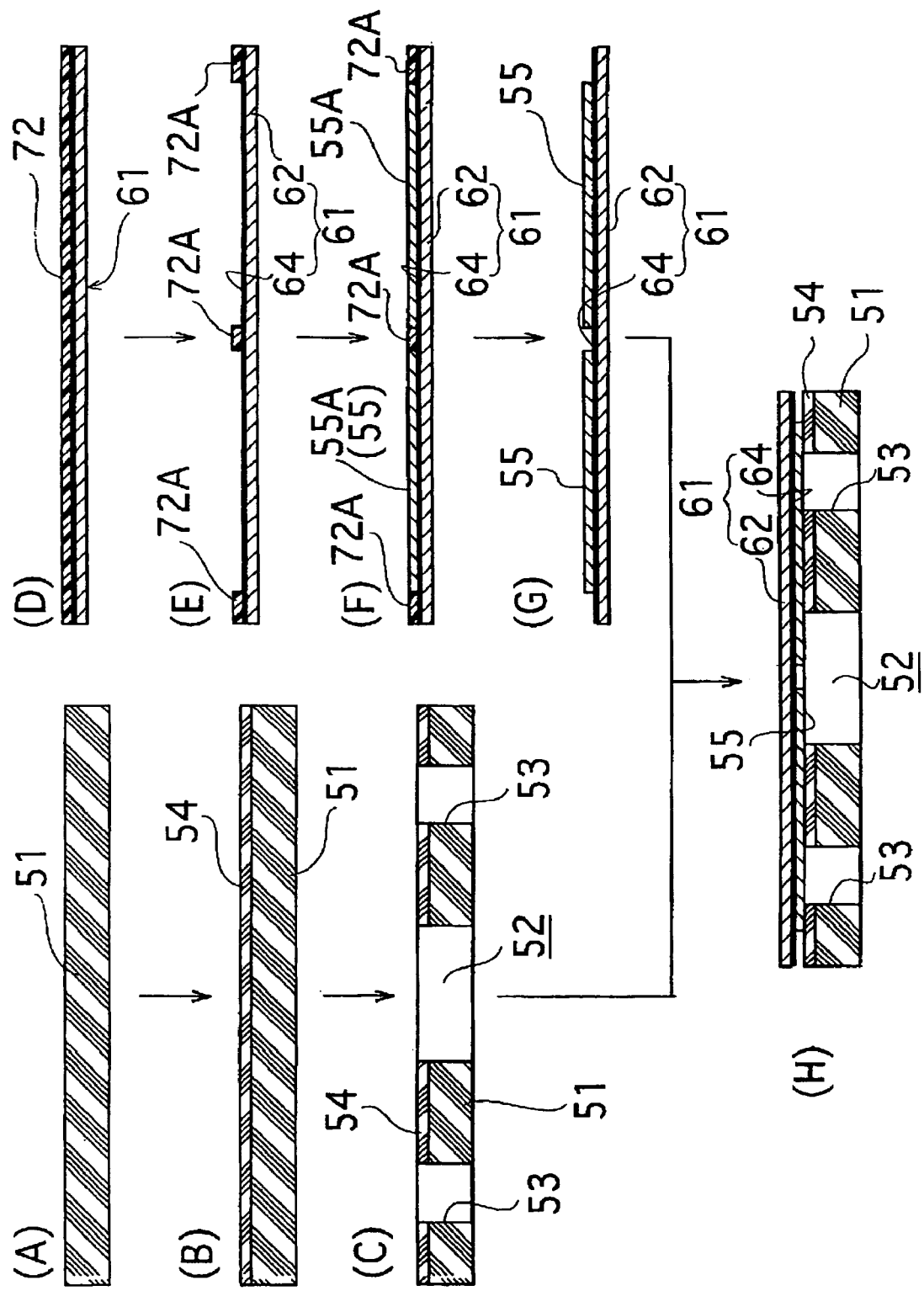
FIG. 3(A) through (H) are stepwise sectional views illustrating a method of manufacturing a device-incorporated substrate according to the first embodiment of the present invention, where (A) through (C) show a void section forming step, (D) through (G) show a pattern forming step, and (H) shows part of a pattern transfer step.

Next, FIG. 2 shows a device-incorporated multi-layer substrate 65 in which a plurality of the device-incorporated substrates 50 configured in the manner described above are layered. In the present example, a configuration where three of the device-incorporated substrates 50 of the configuration described above are mounted on a base substrate 66 is shown. The electrical and mechanical connections between the layers in the device-incorporated multi-layer substrate 65 is achieved through the electrically conductive material 59 that is bonded to the surface of the conductor pattern 55 via the openings 60a in the solder resist 60.

In addition, by connecting the layers with the electrically conductive material 59 as mentioned above, connections can be made in a shorter time and resistance can be kept lower as compared to a case where an electrically conductive paste is used.

The base substrate 66 has an insulating base material 67, an upper wiring layer 70 and a lower wiring layer 71 pattern-formed on the front and back surfaces of the insulating base material 67, and through-hole plating 68 for connecting these wiring layers 70 and 71 formed. In addition, the insides of these through-holes are filled with a filler 69 of either an electrically conductive material or an electrically non-conductive material, and thus, the so-called pop-corn phenomenon is prevented and heat dissipation efficiency is improved.

The device-incorporated multi-layer substrate 65 thus configured takes on the configuration of a land grid array (LGA), and when being mounted on a mother board, external electrodes, such as ball bumps and the like, are provided on the lower wiring layer 71 that is exposed via openings 73a, 73a in a solder resist 73. In addition, some other electric device or electric component may further be mounted on the wiring layer (conductor pattern) 55 of the device-incorporated substrate 50 at the top-most layer.

Next, a method of manufacturing the device-incorporated substrate 50 related to the present invention will be described with reference to FIG. 3 through FIG. 6.

First, as shown in FIG. 3(A), the insulating base material 51 of the configuration described above is prepared, and the adhesive 54 for forming an adhesive material layer is applied onto the surface thereof (FIG. 3(B)).

The adhesive 54 is there to adhere the conductor pattern 55, which is later transferred, to the insulating base material 51, and it is necessary that it be electrically non-conductive. In addition, in order to prevent the adhesive from flowing out into the void section 52 and the through-holes 53 when the conductor pattern 55 is transferred, a material that has low flow and has high shape holding properties is used for the adhesive 54. An example of such a material would include, for example, "AS-3000" produced by Hitachi Chemical Co., Ltd.

Next, as shown in FIG. 3(C), a void section forming step (step S1) for forming the void section 52 for housing a device and the through-holes 53 for connecting layers is carried out with respect to the insulating base material 51. For example, known drilling processing techniques such as processes using drills and routers, mold punching, laser processing and the like may be adopted for the forming of the void section 52 and through-holes 53, and a plurality of sheets may be processed at once. In addition, internal dimensions greater than the outer dimensions of the semiconductor chip 56 to be housed is required for the void section 52.

Figure 5A:
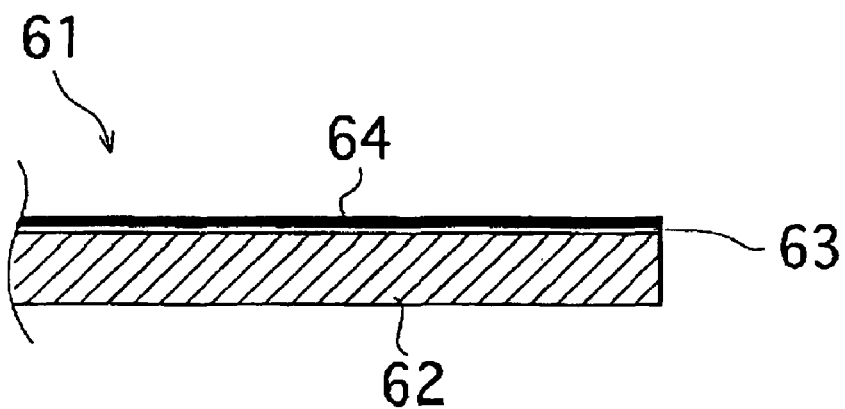
FIG. 5A is a sectional view that shows, schematically, the configuration of a transfer sheet applied in the first embodiment of the present invention.

Along with the preparation step for the insulating base material 51 described above, a step of forming the conductor pattern 55 (step S2) is carried out as shown in FIG. 3(D) through (G). In the present embodiment, in forming the conductor pattern 55, a transfer sheet 61 of the configuration shown in FIG. 5A is used.

The transfer sheet 61 has a three-layer structure of a metal base material 62 of copper of a thickness of, for example, approximately 100 μm, an electrically conductive adhesive resin layer 63, and a dissolvee metal layer 64 of chromium (Cr) of a thickness of, for example, 5 μm or less. The metal base material 62 and the dissolvee metal layer 64 are layered so as to be mutually separable with the electrically conductive adhesive resin layer 63 in between.

The metal base material 62 accounts for the main portion of the entire thickness of the transfer sheet 61, and is so made that it has, mainly, mechanical properties or material properties which are essential for handling. The electrically conductive adhesive resin layer 63 is comprised of a material that is able to ensure conduction between the metal base material 62 and the dissolvee metal layer 64, and that enables both to be separated and removed. For example, benzotriazole resin that is formed in a layer is used. The dissolvee metal layer 64 is comprised of a metal foil or a metal plating layer, and is made of a metal material that is dissimilar from the conductor pattern 55 so that it can be selectively etched with respect to the conductor pattern 55.

In addition, configuration examples for separating and removing both the metal base material 62 and the dissolvee metal layer 64 are not limited to those above, and other configuration examples may also be adopted, details of which will be described later.

Referring to FIG. 3(D), on the surface on the side of the dissolvee metal layer 64 of the transfer sheet 61 of the configuration mentioned above, a photoresist film 72 is formed. The photoresist film 72 may be either of a dry film resist and a liquid resist. Then, the photoresist film 72 is patterned to a predetermined configuration by performing various processes such as exposure and development on the formed photoresist film 72, thereby forming a plating resist 72A (FIG. 3(E)).

Subsequently, the transfer sheet 61 is immersed into, for example, an electrolytic bath of copper along with the plating resist 72A and is connected to a cathode electrode not shown in the drawing, thereby depositing an electroplated layer 55A upon the dissolvee metal layer 64 (FIG. 3(F)). Then, after the electroplated layer 55A is formed, the plating resist 72A is removed (FIG. 3(G)). Thus, the conductor pattern 55 comprised of the electroplated layer 55A is formed on the surface of the transfer sheet 61.

In addition, the electroplated layer 55A is formed not only on the dissolvee metal layer 64 of the transfer sheet 61 but also on the metal base material 62, however, illustration thereof has been omitted.

In general, compared to a method of forming a conductor pattern by removing unwanted parts of a conductor layer through wet etching (a subtractive method), a method of forming a conductor pattern by depositing a conductor layer only in desired places through electroplating (an additive method) allows for the formation of finer patterns. Therefore, according to the present embodiment, fine-pitch conductor patterns with an L/S of, for example, 10 µm/10 µm can be formed with high precision.

In addition, in cases where fine-pitch conductor patterns are not required, a conductor pattern may also be formed by further forming a conductor layer, by such methods as electroplating and the like, on the dissolvee metal layer 64, and pattern etching this conductor layer.

Next, as shown in FIG. 3(H), the transfer sheet 61 and the insulating base material 51 are adhered to each other with the formed conductor pattern 55 in between, and the conductor pattern 55 is adhered to the adhesive 54 on the insulating base material 51 (step S3).

Here, because the transfer sheet 61 is metallic, it has higher strength as compared to a conventional transfer sheet made of a resin film, and therefore, stretching and warpage during handling of the transfer sheet 61 are suppressed, and it is possible to adhere the fine-pitch conductor pattern 55 properly onto the insulating base material 51 with high dimensional stability.

In addition, because the transfer sheet 61 can be given sufficient strength, pattern transfer at higher loads than are conventional becomes possible, and limitations on the transfer process can be reduced. In particular, because local deformations in the transfer sheet upon transfer are suppressed, deformation and breaks in the conductor pattern can be prevented.

Figure 4A:
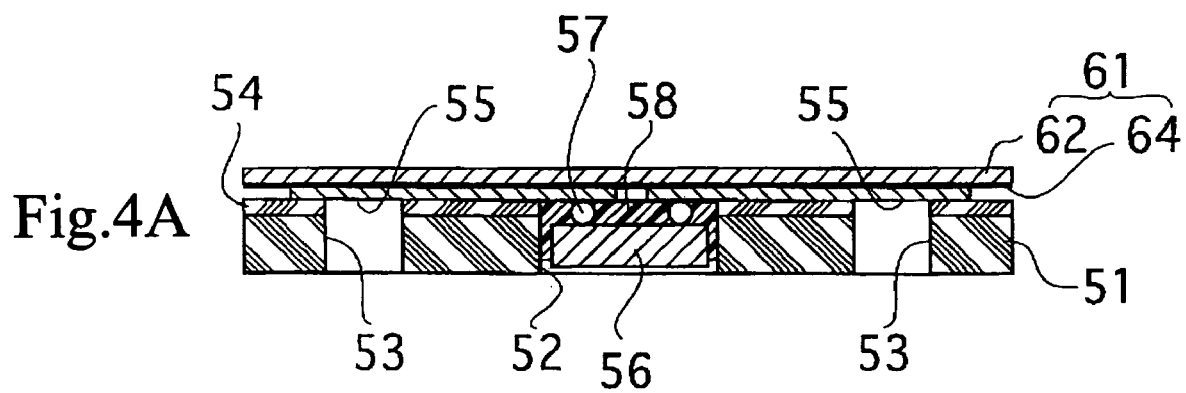
FIG. 4A through FIG. 4D are stepwise sectional views illustrating a method of manufacturing a device-incorporated substrate according to the first embodiment of the present invention, where

Subsequently, as shown in FIG. 4A, a step of housing the semiconductor chip 56 within the void section 52 of the insulating base material 51, and of bonding the bumps 57 formed on the active surface of the semiconductor chip 56 to the conductor pattern 55 is performed (step S4). The mounting of the semiconductor chip 56 with respect to the conductor pattern 55 is performed using, for example, a known mounter apparatus.

In addition, in the present embodiment, since the bumps 57 are formed with gold or with gold plating on their surfaces, if they are bonded directly to the conductor pattern (copper) 55, it becomes a bond between Au—Cu. As such, by further forming a tin (Sn) metal film, through electroplating and the like, on the surface of the conductor pattern 55 formed on the transfer sheet 61, the bonding step mentioned above results in a bond between Au—Sn, and therefore, as compared to a bond between Au—Cu, bonding of the semiconductor chip 56 at lower temperatures and lower loads becomes possible. Sn metals would include Sn and Sn alloys (SnAg, SnBi, SnCu and the like). In addition, besides Sn metals, similar results can also be achieved by forming a NiP/Au film.

On the other hand, instead of forming the bumps 57 of the semiconductor chip 56 with Au, they may be formed with a Sn metal. In such a case, the bumps may be formed solely of a Sn metal, or they may be balls of other metals or resin balls whose surface is plated with a Sn metal. Sn metals would include Sn, SnAg, SnBi, SnCu, SnAgCu, SnAgBi, SnAgBiCu, and the like.

After the semiconductor chip is bonded to the conductor pattern 55, a step of injecting thermosetting resin, such as epoxy, into the void section 52, and forming the underfill resin layer 58 between the conductor pattern 55 and the semiconductor chip 56 is performed (FIG. 4A, step S5). Thus, the conductor pattern 55 is supported by both the transfer sheet 61 and the underfill resin layer 58.

Thus, a "device housing step" related to the present invention is comprised of a step of bonding the semiconductor chip 56 to the conductor pattern 55 and a step of forming the underfill resin layer 58 for sealing the bonded semiconductor chip 56 within the void section 52.

In addition, the step of bonding the semiconductor chip 56 is not limited to the one mentioned above, and the semiconductor chip 56 may be bonded to the conductor pattern 55 on the transfer sheet 61 in advance, and the bonded semiconductor chip 56 may be housed inside the void section 52 when the insulating base material 51 and the transfer sheet 61 are adhered to each other. In this case, since the transfer sheet 61 is metallic, deformation and the like of the transfer sheet 61 due to the weight of the semiconductor chip 56 itself can be suppressed.

Figure 10:
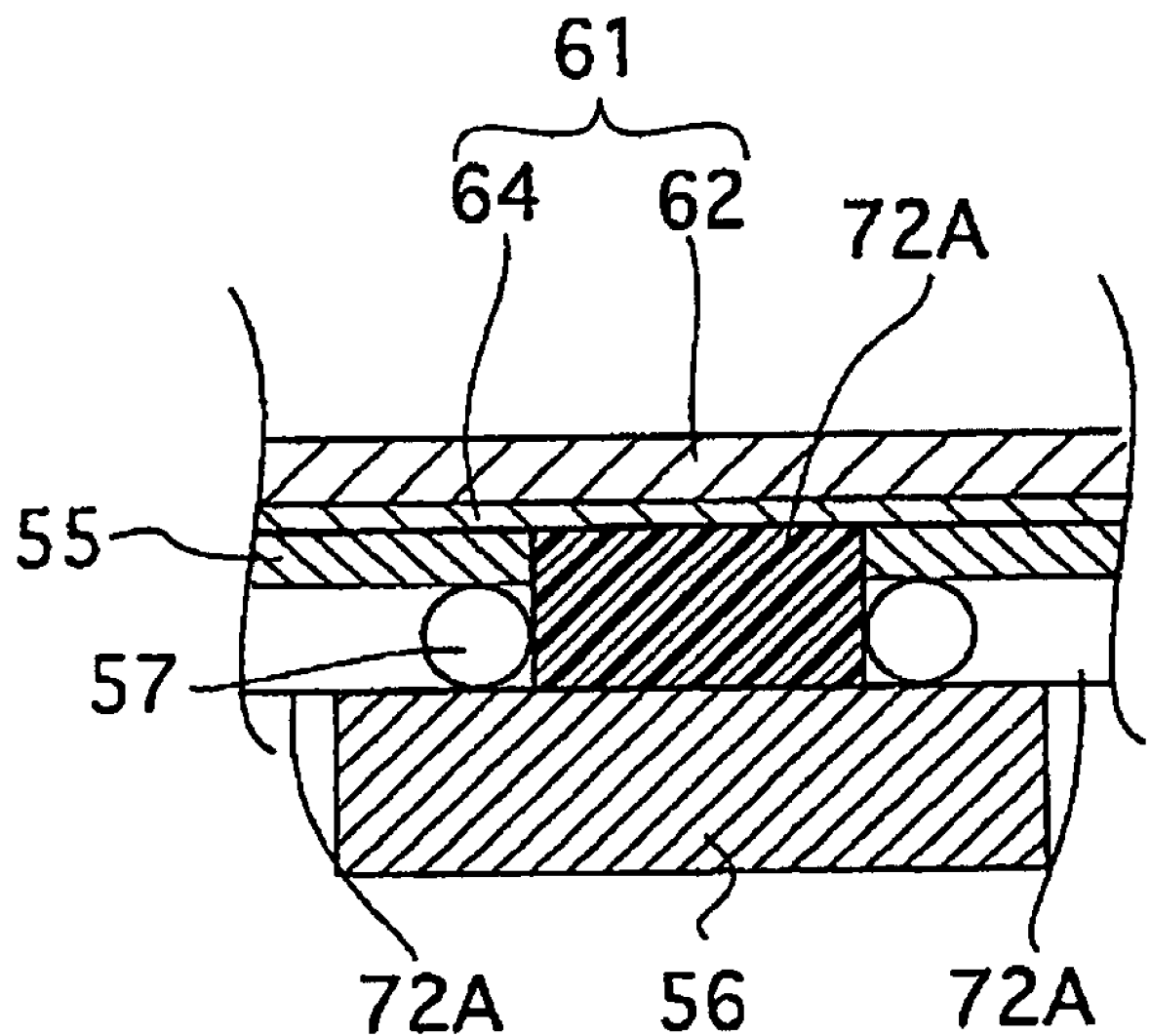
FIG. 10 is a sectional view of a main portion illustrating a modification of a chip mounting step of the first embodiment of the present invention.
Figure 11A:
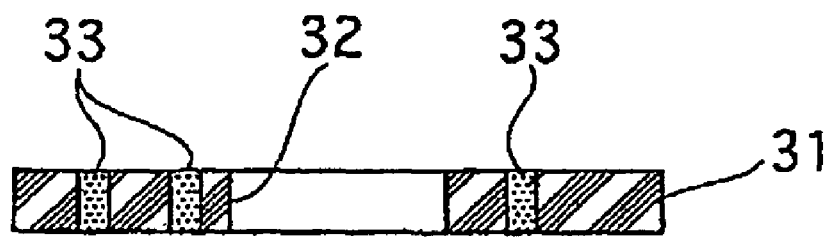
FIG. 11A through FIG. 11F are stepwise sectional views illustrating a conventional method of manufacturing a device-incorporated substrate.
Figure 11B:
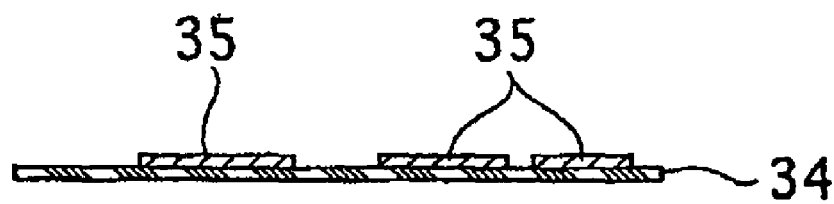
Figure 11C:
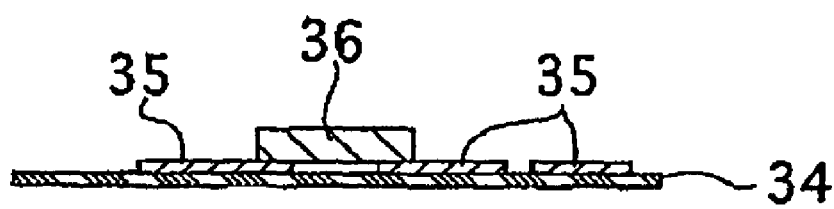
Figure 11D:
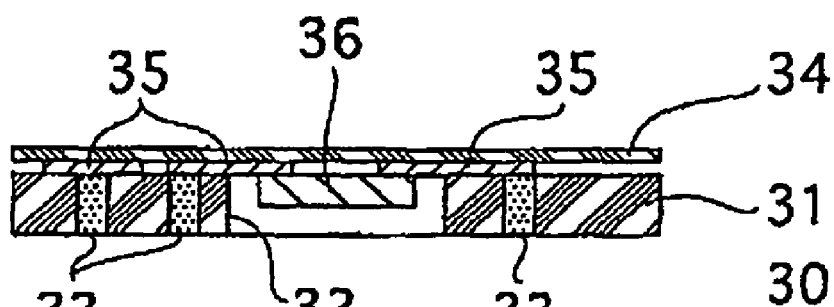
Figure 11E:
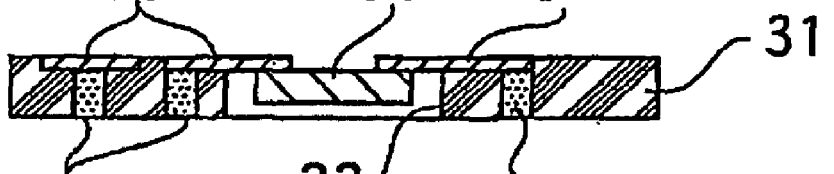
Figure 11F:
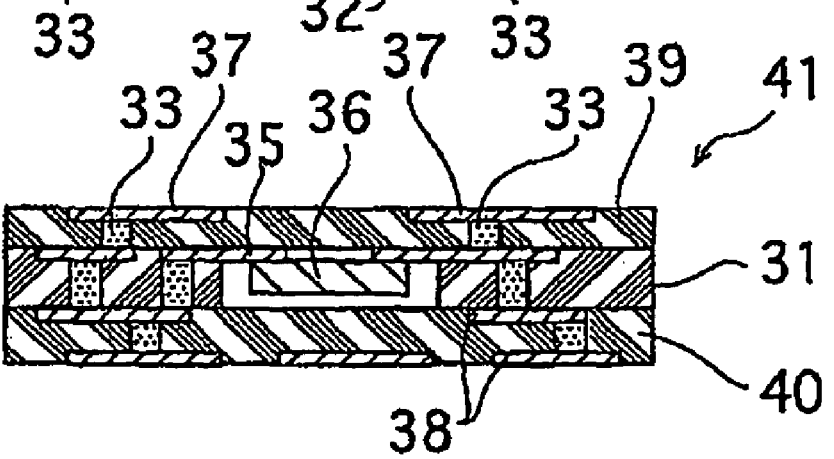

Here, if a substance having adhesive properties is used for the plating resist 72A, it is possible to use the plating resist 72A as an underfill resin layer for the semiconductor chip 56 as shown in FIG. 10, for example. In this case, the thickness of the conductor pattern 55 need only be made a length that can be reached by the bumps 57 of the semiconductor chip 56.

Next, a step of removing the transfer sheet 61 is performed. In the present embodiment, the removal of the transfer sheet 61 is comprised of a step of separating and removing the metal base material 62 from the dissolvee metal layer 64 (FIG. 4B) and a step of dissolving and removing the dissolvee metal layer 64 (FIG. 4C).

Figure 4B:
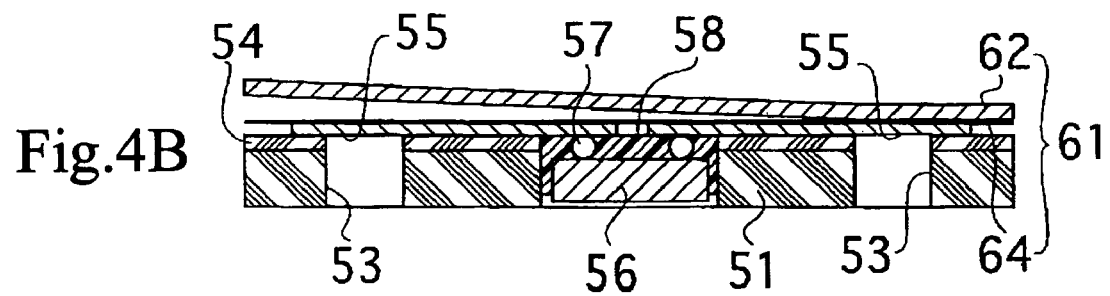
Figure 4C:
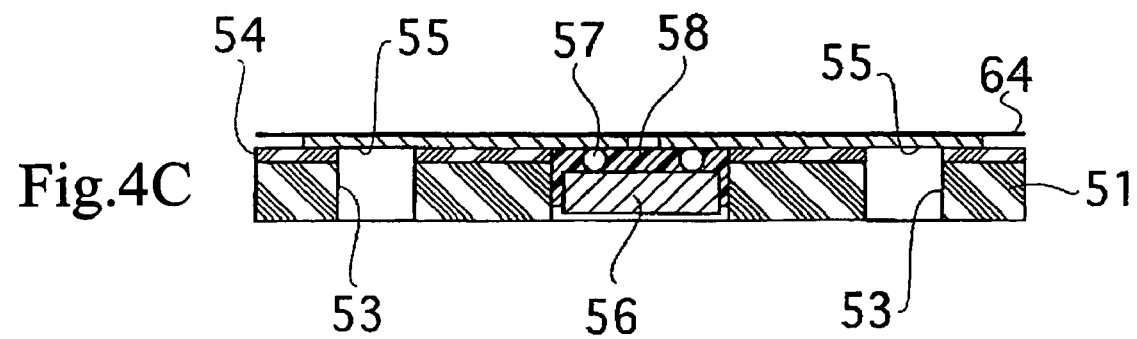
Figure 4D:
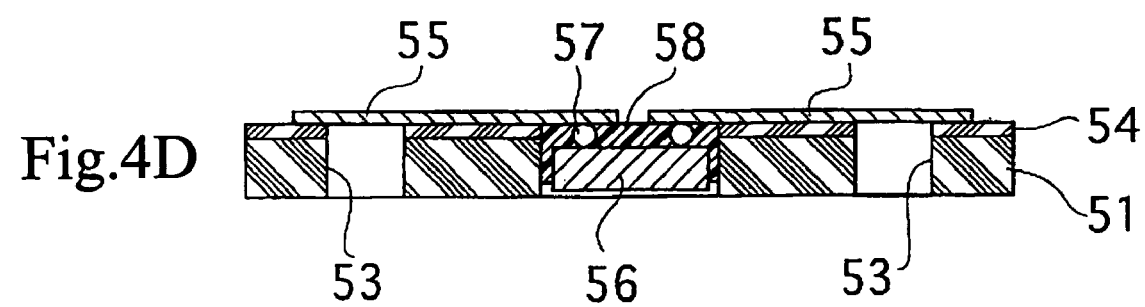

Referring to FIG. 4B, the step of separating and removing the metal base material 62 from the dissolvee metal layer 64 is performed by separating the metal base material 62 from the dissolvee metal layer 64 via the electrically conductive adhesive resin layer 63 (step S6).

In addition, in order to have it separate from the dissolvee metal layer 64 along with the metal base material 62, the electrically conductive adhesive resin layer 63 may have a release agent applied in advance on a predetermined area of its surface on the side of the dissolvee metal layer 64.

By adding, at the boundary section between the metal base material 62 and the dissolvee metal layer 64 at the edge of the transfer sheet 61, a slit for starting separation, the separation process for the metal base material 62 can be performed with ease. In addition, during the process of separating the metal base material 62, since the dissolvee metal layer 64 is supported by the adhesive 54 and the underfill resin layer 58 via the conductor pattern 55, it is possible to perform the separation and removal of the metal base material 62 and the dissolvee metal layer 64 properly (FIG. 4C).

On the other hand, in the step of dissolving and removing the dissolvee metal layer 64, only the dissolvee metal layer 64 is selectively removed (FIG. 4D, step S7) using an etching solution that dissolves the dissolvee metal layer 64 but not the conductor pattern 55. In the present embodiment, since the conductor pattern 55 is formed with copper and the dissolvee metal layer 64 with chromium, by using, for example, a hydrochloric etching solution, just the dissolvee metal layer 64 can be dissolved and removed while leaving the conductor pattern 55.

Thus, a "pattern transfer step" in the present embodiment is comprised of the respective steps from the step of adhering the insulating base material 51 and the transfer sheet 61 to each other (step S3) to the step of dissolving and removing the dissolvee metal layer 64 (step S7).

After the removal of the transfer sheet 61 is completed, an electrical conductor filling step of filling the through-holes 53 of the insulating base material 51 with the electrically conductive material 59 as an electrically conductive material through screen printing or a dispensing method is performed as shown in FIG. 1, while a step of covering the surface of the conductor pattern 55 with the solder resist 60 except for parts corresponding to areas where the through-holes 53 are formed is performed (step S8). In addition, if the device-incorporated multi-layer substrate 65 shown in FIG. 2 is to be obtained, a predetermined multi-layering process is performed (step S9).

Thus, the device-incorporated substrate 50 of the present embodiment is produced.

According to the present embodiment, since the transfer sheet 61 is made metallic, it is possible to form the fine-pitch conductor pattern 55 with high precision using a pattern plating technique based on an electroplating method. In addition, since the transfer sheet 61 has predetermined mechanical strength and heat resistance, dimensional changes during handling or heating is virtually eliminated, and it is possible to ensure the dimensional stability of the conductor pattern 55 that is transferred.

Further, because the removal of the transfer sheet 61 in the pattern transfer step is ultimately performed by way of dissolving through etching after forming the underfill resin layer 58 between the conductor patter 55 and the semiconductor chip 56, even in cases where the rigidity of the insulating base material 51 is strong, it is possible to ensure an adequate operation of transferring the conductor pattern 55.

In addition, according to the present embodiment, since the transfer sheet 61 is so configured to include the metal base material 62 and the dissolvee metal layer 64 that is layered so as to be separable with respect to this metal base material 62, and since the removal of the transfer sheet 61 is comprised of a step of separating and removing the metal base material 62 from the dissolvee metal layer 64 and a step of dissolving and removing the dissolvee metal layer 64, the removal of the transfer sheet 61 is made easier, and thus, an improvement in productivity can be expected.

Second Embodiment

FIG. 7, and FIG. 8A through FIG. 8D show the second embodiment of the present invention. It is to be noted that, in the drawings, the same reference numerals are given to parts that have correspondence in the first embodiment described above, and detailed descriptions thereof will be omitted.

First, as shown in FIG. 7(A), an insulating base material 51 is prepared, and an adhesive for forming an adhesive 54 is applied onto the surface thereof (FIG. 7(B)).

Subsequently, as shown in FIG. 7(C), a void section forming step for forming a void section 52 for housing a device and through-holes 53 for connecting layers is performed with respect to the insulating base material 51.

Figure 7:
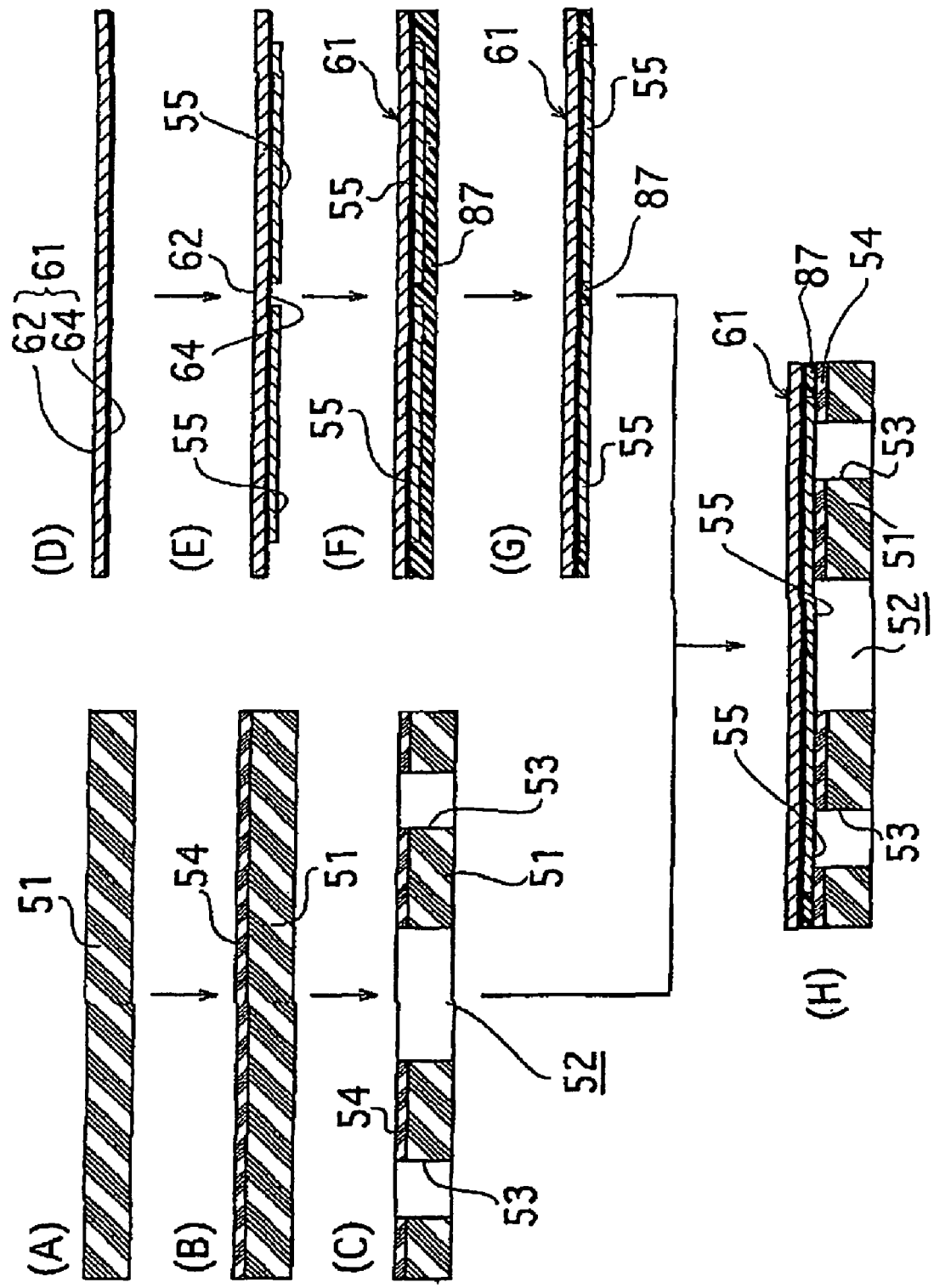
FIG. 7(A) through (H) are stepwise sectional views illustrating a method of manufacturing a device-incorporated substrate according to a second embodiment of the present invention.

In conjunction with the preparation step for the insulating base material 61, a step of forming a conductor pattern 55 is performed as shown in FIG. 7 (D) through (G).

In the present embodiment, in forming the conductor pattern 55, a transfer sheet 61 of the configuration shown in FIG. 5A is used. In other words, it is comprised of a metal base material 62 of copper, a dissolvee metal layer 64 of chromium, and an electrically conductive adhesive resin layer that lies between the two (FIG. 7(D)).

The conductor pattern 55 shown in FIG. 7(E) is, as in the first embodiment described above, comprised of an electroplated layer formed on the surface of the transfer sheet 61 on the side of the dissolvee metal layer 64.

In the present embodiment, a step of burying an insulating film 87 in the gaps in the formed conductor pattern, and of flattening the surface of the transfer sheet 61 on the side of the dissolvee metal layer 64 is then performed.

In this step, first, as shown in FIG. 7(F), an insulating film 87 of an insulating resin such as epoxy resin, for example, is applied onto the entire surface of the transfer sheet 61 on the side of the dissolvee metal layer 64 from above the formed conductor pattern 55 through a screen printing method, and is then cured.

Then, as shown in FIG. 7(G), the cured insulating film 87 is buffed, and the surface of conductor pattern 55 is exposed.

Thus, the insulating film 87 is buried into the gaps of the conductor pattern 55, and the surface of the transfer sheet 61 on the side of the dissolvee metal layer 64 is flattened.

Subsequently, as shown in FIG. 7(H), the transfer sheet 61 and the insulating base material 51 are adhered to each other with the formed conductor pattern 55 in between, thereby adhering the conductor pattern 55 onto the adhesive 54 on the insulating base material 51.

Here, because the transfer sheet 61 is metallic, its strength is higher as compared to a conventional transfer sheet that is comprised of a resin film, and therefore, it is possible to suppress stretching and warpage of the transfer sheet 61 during handling, and to adhere the fine-pitch conductor pattern 55 properly onto the insulating base material 51 with high dimensional stability.

In addition, because sufficient strength can be given to the transfer sheet 61, pattern transferring at higher loads than is conventional becomes possible, and limitations on the transfer process can be reduced. In particular, because local deformations in the transfer sheet upon transfer are suppressed, deformation and breaks in the conductor pattern can be prevented.

Further, because the surface of the transfer sheet 61 on the side of the dissolvee metal layer 64 is flattened by having the insulating film 87 buried in the gaps in the conductor pattern 55, adhesion with the adhesive 54 on the insulating base material 51 can be made stronger, thereby enhancing adhesive strength.

Figure 8:
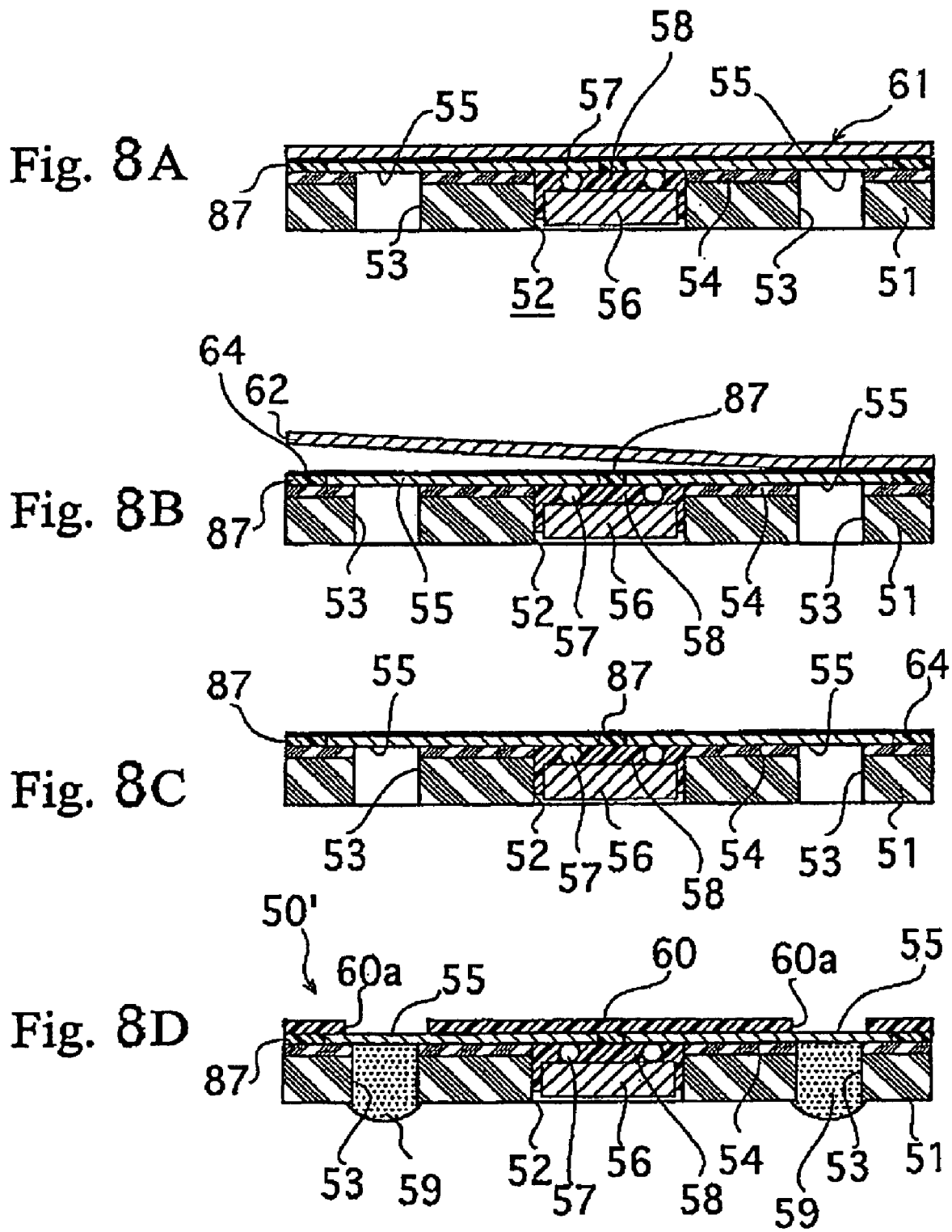
FIG. 8A through FIG. 8D are stepwise sectional views illustrating a method of manufacturing a device-incorporated substrate according to the second embodiment of the present invention.

Subsequently, as shown in FIG. 8A, a step of housing a semiconductor chip 56 inside the void section 52 of the insulating base material 51, and of bonding bumps 57 formed on the active surface thereof to the conductor pattern 65 is performed.

After the semiconductor chip 56 is bonded to the conductor pattern 55, epoxy resin, for example, is injected into the void section 52, thereby forming an underfill resin layer 58 between the conductor pattern 55 and the semiconductor chip 56. Thus, the conductor pattern 55 is supported by both the transfer sheet 61 and the underfill resin layer 58.

In addition, since the bumps of the semiconductor chip 56 are formed with gold or with gold plating on their surfaces, by forming a metal plating of a Sn metal or a Ni/Au metal on the surface of the conductor pattern 55 of copper, chip mounting under low temperature and low load environments may be realized.

In this case, in the present embodiment, since the insulating film 87 is buried between the conductor pattern 55 and the conductor pattern 55, a bridge phenomenon across the pattern due to isotropic growth of the metal plating can be prevented.

In addition, by soft-etching the area corresponding to the chip connection land on the conductor pattern 55 prior to the formation of the metal plating, it is effective in that the flatness of the transfer surface will not be compromised by the formation of the metal plating.

Next, the transfer sheet 61 is removed. The removal of the transfer sheet 61 is comprised of a step of separating and removing the metal base material 62 from the dissolvee metal layer 64 (FIG. 8B), and a step of dissolving and removing the dissolvee metal layer 64 (FIG. 8C).

Since this step of removing the transfer sheet 61 is performed through a method similar to the method described in the first embodiment above, a description thereof will herein be omitted.

After the removal of the transfer sheet 61 is completed, as shown in FIG. 8D, a step of filling the through-holes 53 of the insulating base material 51 with an electrically conductive material 59 as an electrically conductive material through screen printing or a dispensing method, while covering the surface of the conductor pattern 55, except for parts corresponding to areas where the through-holes 53 are formed, with a solder resist 60 is performed.

Thus, a device-incorporated substrate 50' of the present embodiment is produced.

According to the present embodiment, advantages similar to those of the first embodiment described above can be obtained.

In particular, according to the present embodiment, since the conductor pattern 55 can be bonded to the insulating base material 51 with high adhesion strength, it is possible to obtain the device-incorporated substrate 50' that is superior in durability.

In addition, in cases where a metal plating is formed in the chip mounting area of the conductor pattern 55, since short circuiting within the pattern can be prevented, it is possible to accommodate the mounting of semiconductor chips having a narrow pad pitch.

Third Embodiment

Next, FIG. 9A through FIG. 9F show the third embodiment of the present invention. It is to be noted that, in the drawings, the same reference numerals are given to parts that have correspondence in the first embodiment described above, and detailed descriptions thereof will be omitted.

Figure 9:
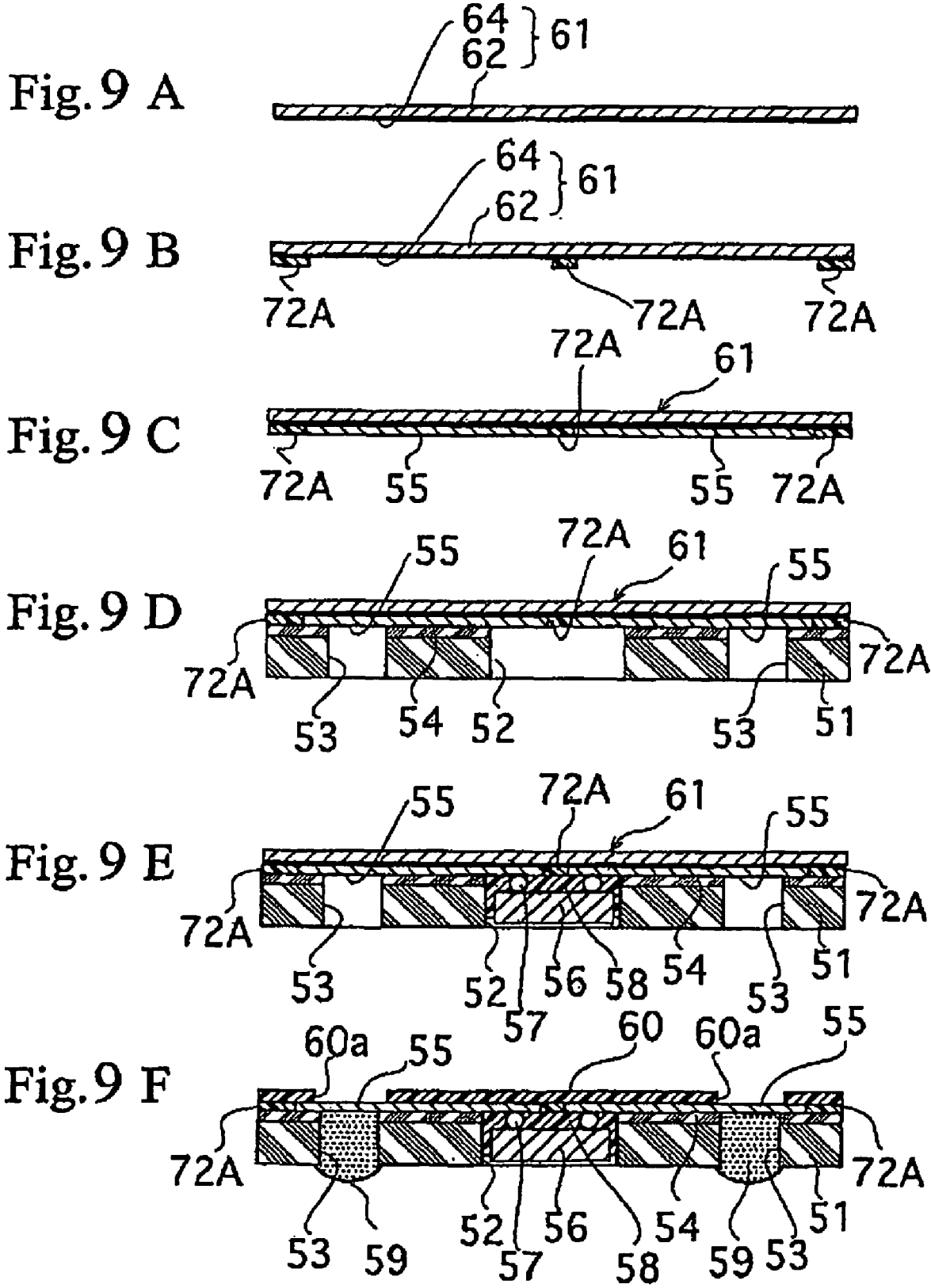
FIG. 9A through FIG. 9F are stepwise sectional views illustrating a method of manufacturing a device-incorporated substrate according to a third embodiment of the present invention.

In the present embodiment, a plating resist 72A (FIG. 9B) for electroplating formed when depositing a conductor pattern 55 on the surface of a transfer sheet 61, shown in FIG. 9A, on the side of a dissolvee metal layer 64 is configured as the insulating film 87 for flattening described in the second embodiment above.

The plating resist 72A is such that, at the time of forming the conductor pattern 55, the gaps in the conductor pattern 55 are filled as shown in FIG. 9C.

Therefore, after the conductor pattern 55 is formed, it becomes possible to adhere it onto an insulating base material 51, as shown in FIG. 9D, without having to separately form an insulating film for flattening, and thus, advantages similar to those of the second embodiment described above can be obtained.

In addition, by using a material having adhesiveness for the plating resist 72A, it is possible to adhere the conductor pattern 55 onto the insulating base material 51 with higher bonding strength.

In addition, in this case, if the wiring density of the conductor pattern 55 is relatively low, it is possible to do without an adhesive 54 on the insulating base material 51.

Since the chip mounting process (FIG. 9E) and the process of removing the transfer sheet (FIG. 9F) after adhering the conductor pattern 55 are similar to those of the first embodiment described above, descriptions thereof will herein be omitted.

Hereinabove, embodiments of the present invention have been described, however, the present invention is by no means limited thereto, and various modifications are possible based on the technical spirit of the present invention.

For example, in the respective embodiments above, the transfer sheet 61 is configured, as shown in FIG. 5A, with the electrically conductive adhesive resin layer 63 lying between the metal base material 62 and the dissolvee metal layer 64 so as to make the metal base material 62 and the dissolvee metal layer 64 separable from each other, but the configuration of the transfer sheet 61 is not limited thereto, and so long as the configuration allows for the separation of the metal base material and the dissolvee metal layer from each other, any configuration may be adopted.

Figure 5B:
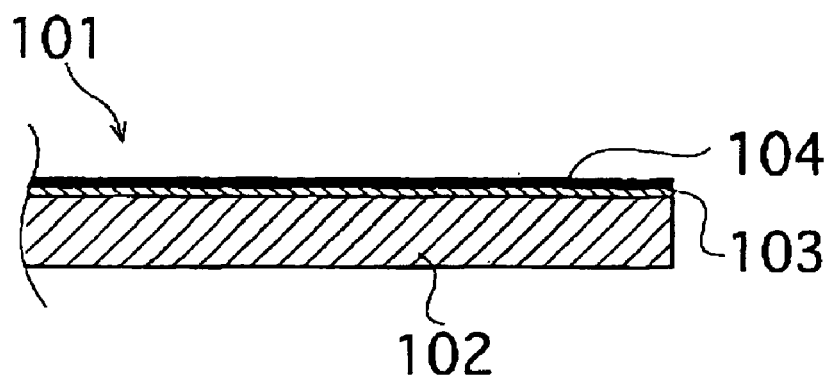
FIG. 5B through FIG. 5D are sectional views illustrating modifications thereof.

For example, a transfer sheet 101, whose sectional structure is shown in FIG. 5B, is configured with an intermediate layer 103 of chromium plating lying between a metal base material 102 of copper and a dissolvee metal layer 104 of nickel plating, and in such a manner that the dissolvee metal layer (Ni) 104 and the intermediate layer (Cr) 103 are separated at the interface making use of the plating stress difference. In the step of melting and removing the dissolvee metal layer (Ni) 104 after the metal base material 102 and the intermediate layer 103 have been removed, if the conductor pattern to be transferred is copper, a sulfated hydrogen peroxide etching solution, for example, may be used.

In addition, in FIG. 5B, if the intermediate layer 103 and the dissolvee metal layer 104 are formed of chromium plating and nickel-cobalt alloy plating, respectively, each of the layers 103 and 104 can be easily separated at the interface thereof. In this case, in the step of dissolving and removing the dissolvee metal layer (Ni/Co) 104, if the conductor pattern to be transferred is copper, a soft-etching agent with a sulfated hydrogen peroxide solution base, for example, may be used.

In addition, in each of the embodiment above, examples in which the removal of the transfer sheet 61 is comprised of the step of separating and removing the metal base material 62, and the step of dissolving and removing the dissolvee metal layer 64 was described, however, instead, the transfer sheet as a whole may be dissolved and removed. In this case, the transfer sheet may be comprised of similar metals, or it may be comprised of a layered body of dissimilar metals. In particular, in the latter case, each metal layer may be selectively etched using different etching solutions.

Figure 5C:
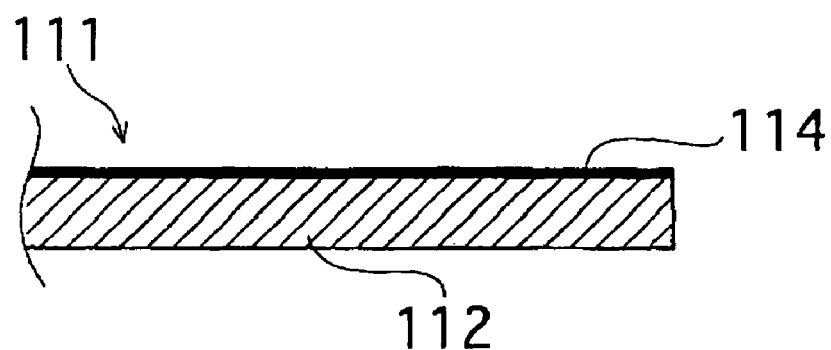
Figure 5D:
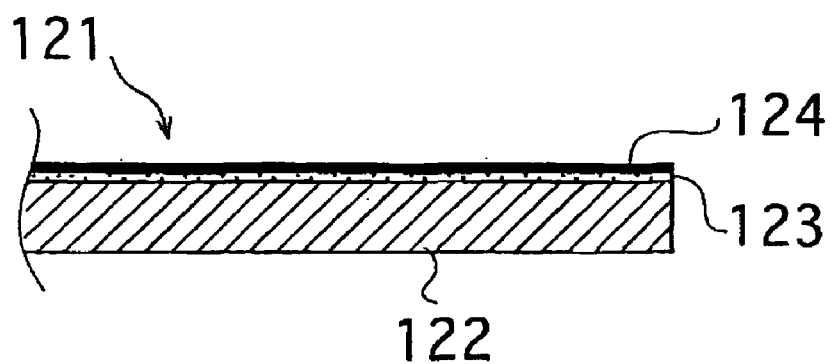
Figure 6:
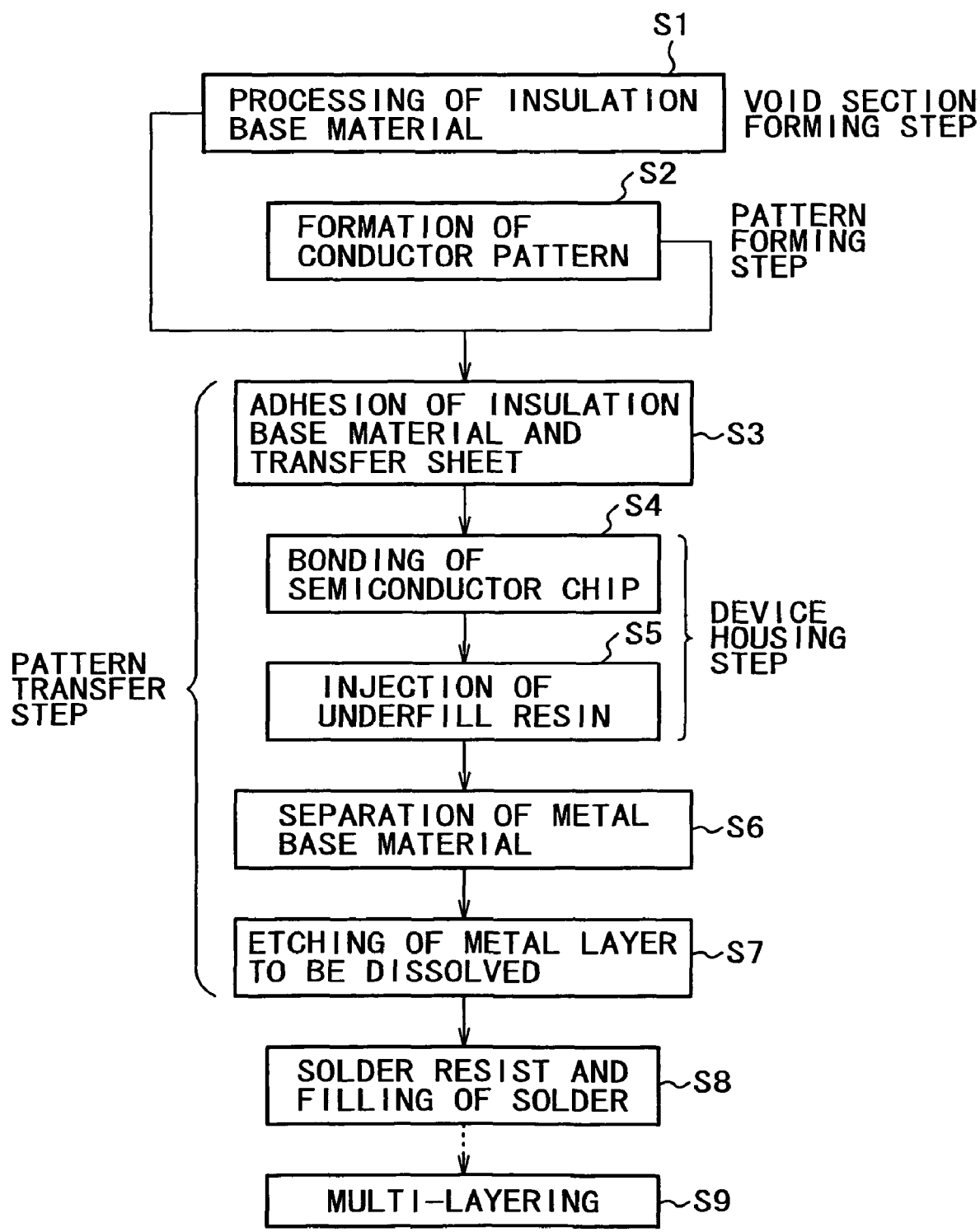
FIG. 6 is a flow chart illustrating a method of manufacturing a device-incorporated substrate according to the first embodiment of the present invention.

For example, FIG. 5C shows the configuration of a transfer sheet 111 comprised of first and second metal layers 112 and 114 that are different from each other. Here, assuming the first metal layer 112 is copper and that the second metal layer 114 is nickel, by using an alkaline etchant, it is possible to etch just the first metal layer (Cu) 112. Similarly, if the first metal layer 112 is copper and the second metal layer 114 is aluminum, by using a warm sulfuric acid solution as an etching solution, it is possible to etch just the first metal layer (Cu) 112. Other combination examples for the first and second metal layers 112 and 114 include nickel and gold, copper and chromium, and the like.

In addition, these combination examples of dissimilar metals can also be applied as combination examples between the metal constituting the dissolvee metal layer (64) and the metal constituting the conductor pattern (55).

Further, the transfer sheet may be comprised of two layers, the metal base layer and the dissolvee metal layer, and each of these layers may be separated by way of the difference in the thermal expansion coefficient between each layer. Alternatively, as in a transfer sheet 121 shown in FIG. 5D, a heat foaming layer 123 may be placed between a metal base layer 122 and a dissolvee metal layer 124, and the metal base layer 122 and the dissolvee metal layer 124 may be separated by foaming the heat foaming layer 123 through a process of heating it to a predetermined temperature.

As described above, according to a method for manufacturing a device-incorporated substrate of the present invention, since a metallic sheet is used for the transfer sheet, it is possible to form a fine-pitch conductor pattern with high precision, and it is also possible to transfer the formed conductor pattern to an insulating layer while ensuring dimensional stability. In addition, because the removal of the transfer sheet is ultimately carried out by dissolving and removing the transfer sheet after forming the sealing resin layer between the conductor pattern and the electric device, it is possible to ensure a proper transfer process for the conductor pattern.

In addition, because the transfer sheet includes a metal base material and a dissolvee metal layer that is layered so as to be separable with respect to the metal base material, and because the removal of this transfer sheet is comprised of a step of separating and removing the metal base material from the dissolvee metal layer and a step of dissolving and removing the dissolvee metal layer, the cost, in terms of time, required for the step of removing the transfer sheet is reduced, and an improvement in productivity can be expected.

The invention claimed is:

1. A method for manufacturing a device-incorporated substrate having an insulating layer, a conductor pattern thereon, a void section formed therein, and an electric device housed in said void section and connected to said conductor pattern, said method comprising:
   providing an insulating layer;
   a void section forming step of forming a void section in said insulating layer;
   providing a transfer sheet comprising a metallic base and a dissolvee metal layer over the metallic base, the transfer sheet being formed separate from, and un-connected to, said insulating layer;
   a pattern forming step of forming a conductor pattern over one surface of said transfer sheet;
   a pattern transfer step of adhering said transfer sheet and said insulating layer to each other with said conductor pattern therebetween;
   a transfer sheet removal step for removing said transfer sheet from at least said conductor pattern;
   a device housing step of housing said electric device within said void section, with said electric device connected to said conductor pattern, the device housing step occurring after the pattern transfer step and before the transfer sheet removal step; and
   wherein neither the metallic base nor the dissolvee metal layer of the transfer sheet is removed prior to said transfer sheet removal step, and said transfer sheet removal step includes dissolving and removing at least a part of said transfer sheet, including at least the dissolvee metal layer, and
   wherein said pattern transfer step occurs after said pattern forming step, and said transfer sheet removal step occurs after said pattern transfer step
   and wherein the electric device that is housed in the void section is directly electrically connected to the conductor pattern via material that is physically in contact with contacts of the electric device and the conductor pattern that is applied to the insulating layer in which the electric device is located.

2. The method for manufacturing a device-incorporated substrate as described in claim 1, characterized in that:
   said pattern forming step is done by an electroplating method.

3. The method for manufacturing a device-incorporated substrate as described in claim 1, characterized in that:
   forming said conductor pattern includes a step of, after said conductor pattern forming step, burying an insulating material in gaps in said formed conductor pattern and subsequently flattening the surface of said transfer sheet such that the surfaces of the conductor pattern and the insulating material are substantially flush.

4. The method for manufacturing a device-incorporated substrate as described in claim 1, characterized in that:
   an adhesive material is applied over one surface of said insulating layer prior to said pattern transfer step in order to aid in the adhesion of said patterned conductor to the insulating layer, the adhesive material being subjected to the same void section forming step as the insulating layer.

5. The method for manufacturing a device-incorporated substrate as described in claim 1, characterized in that:
   said dissolvee metal layer and said conductor pattern are made of different metal material, and said step of dissolving and removing said dissolvee metal layer is done by using an etchant which is able to dissolve said dissolvee metal layer but is unable to dissolve said conductor pattern.

6. The method for manufacturing a device-incorporated substrate as described in claim 1, characterized in that:
   said void section forming step includes a step of forming a through hole together with said void section, for connecting both surfaces of said insulating layer, and a step of filling conductive material into said through hole.

7. The method for manufacturing a device-incorporated substrate as described in claim 6, said method characterized by further comprising:
   layering multiple ones of said formed device-incorporated substrate, with filled through holes forming electric connections therebetween.

8. The method for manufacturing a device-incorporated substrate as described in claim 1, characterized in that said transfer sheet further comprises an adhesive resin formed between said metallic base and said dissolvee metal layer.

9. The method for manufacturing a device-incorporated substrate as described in claim 1, characterized in that said transfer sheet is at least 100 μm thick in order to provide rigidity to the transfer sheet.

10. The method for manufacturing a device-incorporated substrate as described in claim 1, characterized in that said dissolvee metal layer is formed to a thickness of 5 μm or less.

11. The method for manufacturing a device-incorporated substrate as described in claim 1, characterized in that said transfer sheet further comprises a heat foaming layer formed between said metallic base and said dissolvee metal layer.

12. The method for manufacturing a device-incorporated substrate as described in claim 1, characterized in that said transfer sheet removal step further comprises a step of removing said metal base by a physical process prior to removing said dissolvee metal layer by said dissolving process.

13. The method for manufacturing a device-incorporated substrate as described in claim 1, wherein said device housing step further includes a sealing step of forming a seal resin layer between said conductor pattern and said electric device.

* * * * *